US011996498B2

(12) United States Patent
Wu et al.

(10) Patent No.: US 11,996,498 B2
(45) Date of Patent: May 28, 2024

(54) SUBPIXEL STRUCTURE HAVING LIGHT SHIELDING LAYER, PIXEL STRUCTURE HAVING LIGHT SHIELDING LAYER, AND LIGHT EMITTING DIODE CHIP LIGHT SHIELDING LAYER

(71) Applicant: Industrial Technology Research Institute, Hsinchu (TW)

(72) Inventors: Ming-Hsien Wu, Hsinchu County (TW); Yao-Jun Tsai, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 260 days.

(21) Appl. No.: 16/990,968

(22) Filed: Aug. 11, 2020

(65) Prior Publication Data
US 2021/0280747 A1 Sep. 9, 2021

(30) Foreign Application Priority Data
Mar. 5, 2020 (TW) .................. 109107177

(51) Int. Cl.
*H01L 33/38* (2010.01)
*H01L 33/48* (2010.01)
*H01L 33/58* (2010.01)
*H01L 33/62* (2010.01)

(52) U.S. Cl.
CPC .......... *H01L 33/486* (2013.01); *H01L 33/382* (2013.01); *H01L 33/58* (2013.01); *H01L 33/62* (2013.01)

(58) Field of Classification Search
CPC ............... H01L 33/58; H01L 33/60; H01L 27/3211–3218; H01L 33/486; H01L 33/382; H01L 33/62; H01L 33/44; H01L 33/38; H01L 27/156; H01L 25/167; H01L 33/36; H01L 33/38385; H01L 33/387; G09G 3/32; G09G 2300/0439

See application file for complete search history.

(56) References Cited

U.S. PATENT DOCUMENTS 8,552,436 B2  10/2013  Bibl et al.
8,791,474 B1   7/2014  Bibl et al.
8,809,875 B2   8/2014  Bibl et al.
9,831,387 B2  11/2017  Chu et al.
(Continued)

FOREIGN PATENT DOCUMENTS

CN   102185066   9/2011
CN   203707123   7/2014
(Continued)

OTHER PUBLICATIONS

Pengfei Tian, et al., "Size-dependent efficiency and efficiency droop of blue InGaN micro-light emitting diodes" Appl. Phys. Lett. 101, 231110 (2012), Dec. 6, 2012, pp. 231110-231110-4.
(Continued)

*Primary Examiner* — Davienne N Monbleau
*Assistant Examiner* — Gustavo G Ramallo
(74) *Attorney, Agent, or Firm* — JCIPRNET

(57) ABSTRACT

A subpixel structure includes a substrate and a light emitting diode chip. The light emitting diode chip is disposed on the substrate. The light emitting diode chip has a chip area and a light emitting area, and the light emitting area is less than or equal to one tenth of the chip area.

19 Claims, 10 Drawing Sheets

L02

(56) References Cited

U.S. PATENT DOCUMENTS

| | | | |
|---|---|---|---|
| 2004/0080251 A1* | 4/2004 | Steranka | H01L 33/46 |
| | | | 257/E33.068 |
| 2011/0025190 A1* | 2/2011 | Jagt | H01L 33/58 |
| | | | 313/499 |
| 2013/0126891 A1 | 5/2013 | Bibl et al. | |
| 2015/0084054 A1 | 3/2015 | Fan et al. | |
| 2017/0331004 A1 | 11/2017 | Fujimori et al. | |
| 2017/0365744 A1* | 12/2017 | Lee | H01L 33/385 |
| 2018/0261736 A1 | 9/2018 | Bonar et al. | |
| 2018/0269268 A1* | 9/2018 | Cai | H10K 59/122 |
| 2020/0212102 A1* | 7/2020 | Park | H01L 33/62 |
| 2020/0302835 A1* | 9/2020 | Ohmae | G09F 9/33 |

FOREIGN PATENT DOCUMENTS

| | | |
|---|---|---|
| CN | 107403819 | 11/2017 |
| CN | 110504280 | 11/2019 |
| TW | 200926454 | 6/2009 |
| TW | 201721618 | 6/2017 |
| TW | I607559 | 12/2017 |
| TW | 202008609 | 2/2020 |
| TW | I686962 | 3/2020 |

OTHER PUBLICATIONS

Seongmo Hwang, et al., "A Hybrid Micro-Pixel Based Deep Ultraviolet Light-Emitting Diode Lamp", Applied Physics Express 4 (2011) 012102, Dec. 16, 2010, pp. 012102-1-012102-3.

Bok Y. Ahn, et al., "Omnidirectional Printing of Flexible, Stretchable, and Spanning Silver Microelectrodes", Science 323 (5921), Mar. 20, 2009, pp. 1590-1593.

Sang-Il Park, et al., "Printed Assemblies of Inorganic Light-Emitting Diodes for Deformable and Semitransparent Displays", Science 325 (5943), Aug. 21, 2009, pp. 977-981.

Zheng Gong, et al., "Size-dependent light output, spectral shift, and self-heating of 400 nm InGaN light-emitting diodes", J. Appl. Phys. 107, 013103 (2010), Jan. 6, 2010, pp. 013103-013103-6.

"Office Action of Taiwan Counterpart Application", dated Sep. 17, 2020, p. 1-p. 10.

"Office Action of China Counterpart Application", issued on Feb. 20, 2024, pp. 1-11.

* cited by examiner

SUBPIXEL STRUCTURE HAVING LIGHT SHIELDING LAYER, PIXEL STRUCTURE HAVING LIGHT SHIELDING LAYER, AND LIGHT EMITTING DIODE CHIP LIGHT SHIELDING LAYER

CROSS-REFERENCE TO RELATED APPLICATION

This application claims the priority benefit of Taiwan application serial no. 109107177, filed on Mar. 5, 2020. The entirety of the above-mentioned patent application is hereby incorporated by reference herein and made a part of this specification.

TECHNICAL FIELD

The disclosure relates to a subpixel structure, a pixel structure, and a light emitting diode chip for the same.

BACKGROUND

In a display, a horizontal or vertical light emitting diode chip may be used as a subpixel. In particular, a horizontal light emitting diode chip has a size limitation due to mass transfer, and a vertical light emitting diode chip is difficult to test and repair.

SUMMARY

The disclosure provides a subpixel structure, a pixel structure, and a light emitting diode chip for the same suitable for mass transfer, wherein a small light emitting area may be readily achieved without reducing chip area so as to increase contrast.

A subpixel structure according to an embodiment includes a substrate and a light emitting diode chip. The light emitting diode chip is disposed on the substrate. The light emitting diode chip has a chip area and a light emitting area, and the light emitting area is less than or equal to one tenth of the chip area. The light emitting diode chip includes a first semiconductor layer, a light emitting layer, a second semiconductor layer, a first electrode contact, and a second electrode contact. The first semiconductor layer has a first doping type. The light emitting layer is disposed on the first semiconductor layer. The second semiconductor layer is disposed on the light emitting layer and has a second doping type different from the first doping type. The first electrode contact is electrically connected to the first semiconductor layer. The second electrode contact is electrically connected to the second semiconductor layer. At least one of the first electrode contact and the second electrode contact is not overlapped with a light emitting region of the light emitting diode chip in a stacking direction of the first semiconductor layer, the light emitting layer, and the second semiconductor layer.

A pixel structure according to an embodiment includes a substrate and a plurality of light emitting diode chips. The plurality of light emitting diode chips are disposed on the substrate. At least one of the plurality of light emitting diode chips has a chip area and a light emitting area, and the light emitting area is less than or equal to one tenth of the chip area. The pixel structure has a pixel area, the plurality of light emitting diode chips have a total light emitting area, and the total light emitting area is less than or equal to one thirtieth of the pixel area. At least one of the plurality of light emitting diode chips includes a first semiconductor layer, a light emitting layer, a second semiconductor layer, a first electrode contact, and a second electrode contact. The first semiconductor layer has a first doping type. The light emitting layer is disposed on the first semiconductor layer. The second semiconductor layer is disposed on the light emitting layer and has a second doping type different from the first doping type. The first electrode contact is electrically connected to the first semiconductor layer. The second electrode contact is electrically connected to the second semiconductor layer. In at least one of the plurality of light emitting diode chips, at least one of the first electrode contact and the second electrode contact is not overlapped with a light emitting region of the light emitting diode chip in a stacking direction of the first semiconductor layer, the light emitting layer, and the second semiconductor layer.

A light emitting diode chip according to an embodiment includes a first semiconductor layer, a light emitting layer, a second semiconductor layer, a first electrode contact, a second electrode contact, and a light shielding layer. The first semiconductor layer has a first doping type. The light emitting layer is disposed on the first semiconductor layer. The second semiconductor layer is disposed on the light emitting layer. The second semiconductor layer has a second doping type different from the first doping type. The first electrode contact is electrically connected to the first semiconductor layer. The second electrode contact is electrically connected to the second semiconductor layer. The light shielding layer is disposed on the second semiconductor layer. The light shielding layer exposes a light emitting region of the light emitting diode chip. At least one of the first electrode contact and the second electrode contact is not overlapped with the light emitting region of the light emitting diode chip in a stacking direction of the first semiconductor layer, the light emitting layer, and the second semiconductor layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
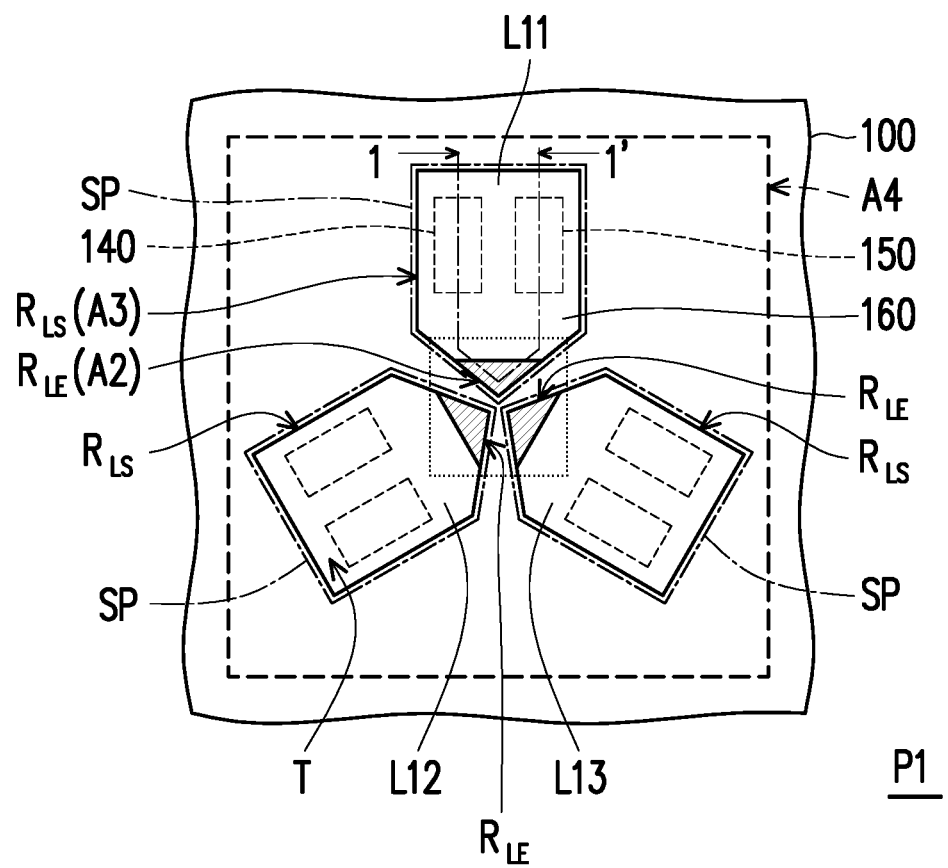
FIG. 1 is a diagram of an exemplary pixel structure.

The embodiments of the disclosure are described in detail below with reference to the accompanying drawings. It may be understood that the drawings are for description and explanation, not limitation. For clarity, elements may not be drawn to scale. In addition, some elements and/or reference numerals may be omitted in some drawings. In the specification and the drawings, the same or similar reference numerals are used to indicate the same or similar elements. When describing one element as "disposed on", "connected to" . . . another element, the element may be "directly disposed on", "directly connected to" . . . another element, or there may be a middle element, without special restrictions. When the number of an element is not specified, one or more of the element may be present, and when "a plurality of" is used to indicate the number of the element, two, three, four, or more of the element may be present. It may be expected that elements and features in an embodiment may be incorporated into another embodiment and bring benefits if feasible, without further explanation.

FIG. 1 shows an exemplary pixel structure P1. The pixel structure P1 includes a substrate 100 and a plurality of light emitting diode chips L11, L12, and L13. According to some embodiments, the pixel structure P1 includes a plurality of subpixel structures SP. For example, three subpixel structures SP are shown in FIG. 1, including the light emitting diode chips L11, L12, and L13, respectively. More specifically, each of the subpixel structures SP includes the substrate 100 and the light emitting diode chip L11, L12, or L13 disposed thereon. At least one of the light emitting diode chips L11, L12, and L13 has a chip area A1 and a light emitting area A2, and the light emitting area A2 is less than or equal to one tenth of the chip area A1. Specifically, each of the light emitting diode chips L11, L12, and L13 has a light emitting region $R_{LE}$ and a non-light emitting region $R_{LS}$. It is defined here that the upper surface of the light emitting diode chip in the light emitting region $R_{LE}$ and the upper surface of the light emitting diode chip in the non-light emitting region $R_{LS}$, whether coplanar or not, form an upper surface T of the light emitting diode chip. The upper surface of the light emitting diode chip in the light emitting region $R_{LE}$ has the light emitting area A2, the upper surface of the light emitting diode chip in the non-light emitting region $R_{LS}$ has a non-light emitting area A3, and the sum of the two is the chip area A1 of the light emitting diode chip. The pixel structure P1 has a pixel area A4, and the light emitting diode chips L11, L12, and L13 have a total light emitting area (that is, the sum of light emitting areas of a plurality of light emitting diode chips, which is the sum of the three light emitting areas A2 of the diode chips L11, L12, and L13 in FIG. 1), and the total light emitting area is less than or equal to one thirtieth of the pixel area A4.

Figure 2A:
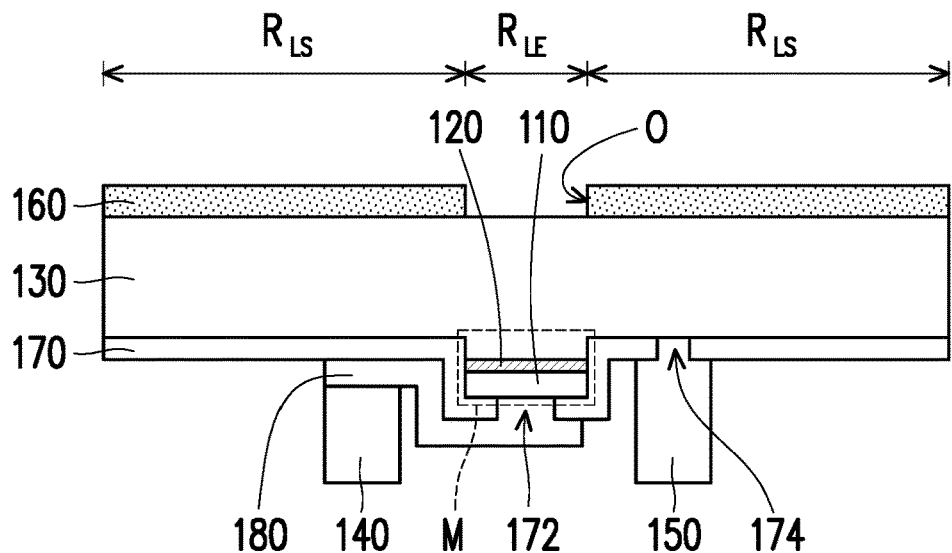
FIG. 2A to FIG. 2B are diagrams of an exemplary light emitting diode chip.
Figure 2B:
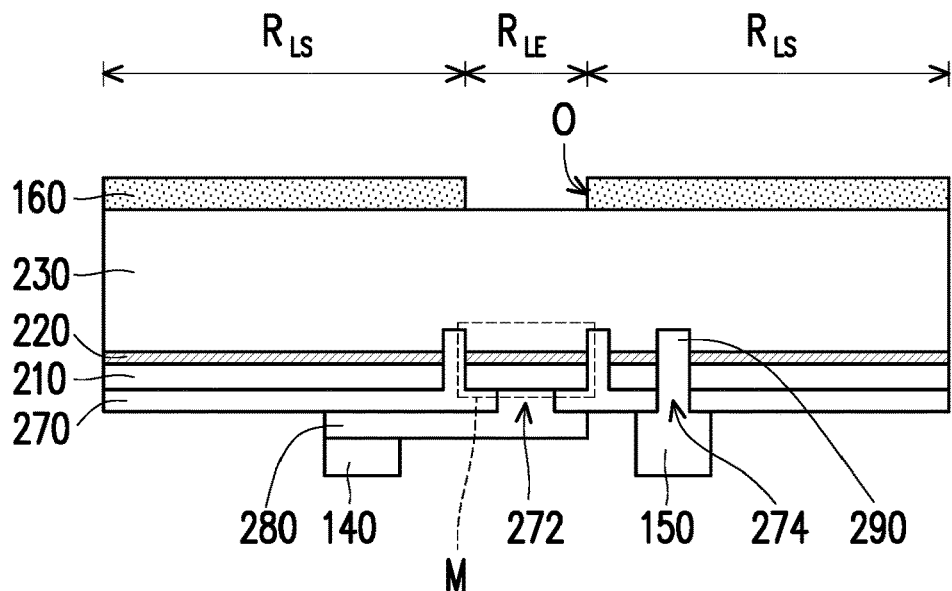

Specific embodiments of the light emitting diode chip applicable to the pixel structure P1 and the subpixel structures SP are now provided. FIG. 2A to FIG. 2B show a plurality of different exemplary light emitting diode chips, wherein FIG. 2A to FIG. 2B are both cross sectional views along section line 1-1' in FIG. 1. Although FIG. 2A to FIG. 2B are shown by a cross section along section line 1-1' in FIG. 1, it may be understood that all the light emitting diode chips in the disclosure may have similar structures.

Referring to FIG. 2A, a light emitting diode chip L01 includes a first semiconductor layer 110, a light emitting layer 120, a second semiconductor layer 130, a first electrode contact 140, a second electrode contact 150, and a light shielding layer 160. The first semiconductor layer 110 has a first doping type. The light emitting layer 120 is disposed on the first semiconductor layer 110. The second semiconductor layer 130 is disposed on the light emitting layer 120. The second semiconductor layer 130 has a second doping type different from the first doping type. The first electrode contact 140 is disposed under the first semiconductor layer 110 and electrically connected to the first semiconductor layer 110. The second electrode contact 150 is disposed under the second semiconductor layer 130 and electrically connected to the second semiconductor layer 130. The light shielding layer 160 is disposed on the second semiconductor layer 130. The light shielding layer 160 exposes the light emitting region $R_{LE}$ of the light emitting diode chip L01.

For the light emitting diode chip L01 according to an embodiment, the light emitting region $R_{LE}$ is substantially defined by a light exit region M of the light emitting diode chip L01, and a region other than the light emitting region $R_{LE}$ is the non-light emitting region $R_{LS}$. In the present embodiment, an opening O of the light shielding layer 160 is overlapped with the light emitting region $R_{LE}$, that is, the opening O of the light shielding layer 160 is determined by the distribution of the light exit region M. The arrangement of the light shielding layer 160 may further identify the light emitting region $R_{LE}$ and the non-light emitting region $R_{LS}$ of the light emitting diode chip L01. With the arrangement of the light shielding layer 160, a small light emitting area A2 may be readily provided at a predetermined position, thus improving the contrast of the display and providing a good beam profile. In the present embodiment, the use of a horizontal light emitting diode chip may still provide a small light emitting area A2. Specifically, the size of the light emitting region $R_{LE}$ in one dimension may be on the micrometer (μm) scale, i.e., a micro light emitting diode may be less than or equal to 100 micrometers. In addition, a horizontal light emitting diode chip facilitates the test and repair of a dead pixel. In addition, a light emitting diode chip having a larger size may be suitably selected to facilitate the process without influence in the display effect. The light shielding layer 160 is formed by, for example, but not limited to, a metal or a black matrix material.

The light emitting diode chip L01 may further include an insulating layer 170 disposed between the first semiconductor layer 110, the light emitting layer 120, and the second semiconductor layer 130, and the first electrode contact 140 and the second electrode contact 150. The insulating layer 170 has a first opening 172 and a second opening 174. The first electrode contact 140 is in contact with the first semiconductor layer 110 via the first opening 172, and the second electrode contact 150 is in contact with the second semiconductor layer 130 via the second opening 174. According to some embodiments, after the first semiconductor layer 110, the light emitting layer 120, and the second semiconductor layer 130 are stacked, the first semiconductor layer 110, the second semiconductor layer 130, and the light emitting layer 120 are partially removed. Therefore, in the resulting structure, the second semiconductor layer 130 may have a protruding portion, and the light emitting layer 120 and the first semiconductor layer 110 are only overlapped at the protruding portion. As shown in FIG. 2A, according to some embodiments, the insulating layer 170 is extended from the lower surface of the second semiconductor layer 130 to at least the side surface of the first semiconductor layer 110 via the side surface of the light emitting layer 120. In addition, the light emitting diode chip L01 further includes a connecting conductor 180. The connecting conductor 180 is disposed between the first electrode contact 140 and the insulating layer 170. An end of the connecting conductor 180 is connected to the first electrode contact 140, and another end thereof is connected to the first semiconductor layer 110 via the first opening 172.

Referring to FIG. 2B, another light emitting diode chip L02 includes a first semiconductor layer 210, a light emitting layer 220, a second semiconductor layer 230, the first electrode contact 140, the second electrode contact 150, and the light shielding layer 160. The following describes the differences between the light emitting diode chip L02 and the light emitting diode chip L01 shown in FIG. 2A. Details and features of the first electrode contact 140, the second electrode contact 150, and the light shielding layer 160 are described above. The common points of the first semiconductor layer 210, the light emitting layer 220, and the second semiconductor layer 230 and the first semiconductor layer 110, the light emitting layer 120, and the second semiconductor layer 130 are also not repeated herein. In the present embodiment, a distribution range of the first semiconductor layer 210, the light emitting layer 220, and the second semiconductor layer 230 may be greater than a distribution range of the light exit region M.

The light emitting diode chip L02 may further include an insulating layer 270. For the relative configuration between the insulating layer 270 and other layers, and the descriptions of, for example, a first opening 272 and a second opening 274 of the insulating layer 270, please refer to the above, which are not repeated herein. The insulating layer 270 is disposed on the lower surface of the first semiconductor layer 210 and has a portion extended through the first semiconductor layer 210 and the light emitting layer 220 to the second semiconductor layer 230, and the light emitting diode chip L02 further includes a first connecting conductor 280 and a second connecting conductor 290. The first connecting conductor 280 is disposed between the first electrode contact 140 and the insulating layer 270. An end of the first connecting conductor 280 is connected to the first electrode contact 140, and another end thereof is connected to the first semiconductor layer 210 via the first opening 272. The second connecting conductor 290 is extended through the first semiconductor layer 210 and the light emitting layer 220 to the second semiconductor layer 230. An end of the second connecting conductor 290 is connected to the second electrode contact 150, and another end thereof is connected to the second semiconductor layer 230.

Please refer to FIG. 1. According to some embodiments, for each of the light emitting diode chips L11, L12, and L13, the orthographic projection of at least one of the first electrode contact 140 and the second electrode contact 150 on the upper surface T of the light emitting diode chip may fall outside the light emitting region $R_{LE}$. That is, at least one of the first electrode contact 140 and the second electrode contact 150 may not be overlapped with the light emitting region $R_{LE}$ of the light emitting diode chip (such as the light emitting diode chip L11, L12, or L13) in the stacking direction of the first semiconductor layer 110, the light emitting layer 120, and the second semiconductor layer 130 (or the first semiconductor layer 210, the light emitting layer 220, and the second semiconductor layer 230). For example, the first electrode contact 140 and the light emitting region $R_{LE}$ may not be overlapped in the stacking direction of the first semiconductor layer 110, the light emitting layer 120, and the second semiconductor layer 130 (or the first semiconductor layer 210, the light emitting layer 220, and the second semiconductor layer 230), and the second electrode contact 150 and the light emitting region $R_{LE}$ may not be overlapped in the stacking direction of the first semiconductor layer 110, the light emitting layer 120, and the second semiconductor layer 130 (or the first semiconductor layer 210, the light emitting layer 220, and the second semiconductor layer 230). The chip area A1 of the pixel structure P1 is a pentagon. In some embodiments, as indicated by the dotted line in FIG. 1, the light emitting region $R_{LE}$ is close to the center of the pixel structure P1. In the application of a display, the plurality of light emitting diode chips L11, L12, and L13 may be light emitting diode chips emitting light of different colors. For example, the light emitting diode chips L11, L12, and L13 may be red, green, and blue light emitting diode chips, respectively, but are not limited thereto.

The content of the above embodiments is mainly directed to the light emitting diode and related details thereof. However, it may be understood that although omitted in the description and the attached drawings in order not to obscure the point of the disclosure, the substrate 100 may include circuits, elements, and the like for the light emitting diode chips L11, L12, and L13, and those having ordinary skill in the art may adjust existing circuits, elements, and the like in accordance with the subpixel structures and the pixel structure of the disclosure without implementation difficulties.

What is described so far is only the case where one light emitting diode chip is provided with only one light emitting region $R_{LE}$. However, it may be understood that, in some embodiments, for one light emitting diode chip, the number of the light emitting region $R_{LE}$ is a plurality. More specifically, one light emitting diode chip may include a plurality of sub chips, and the sub chips respectively include one of the plurality of light emitting regions $R_{LE}$.

Figure 3A:
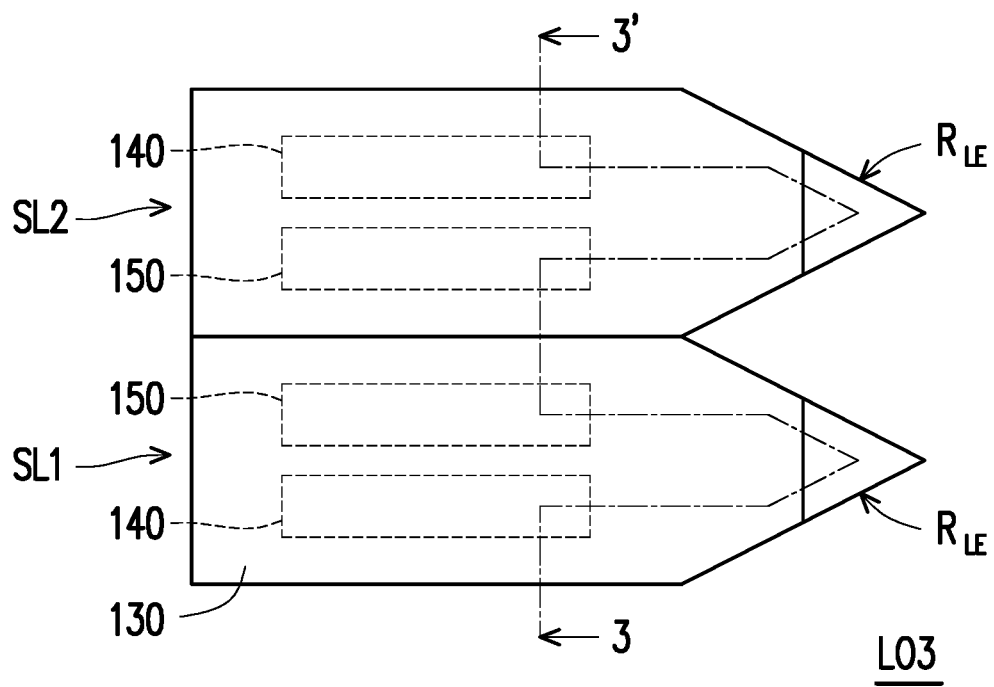
FIG. 3A to FIG. 3B are diagrams of an exemplary light emitting diode chip.
Figure 3B:
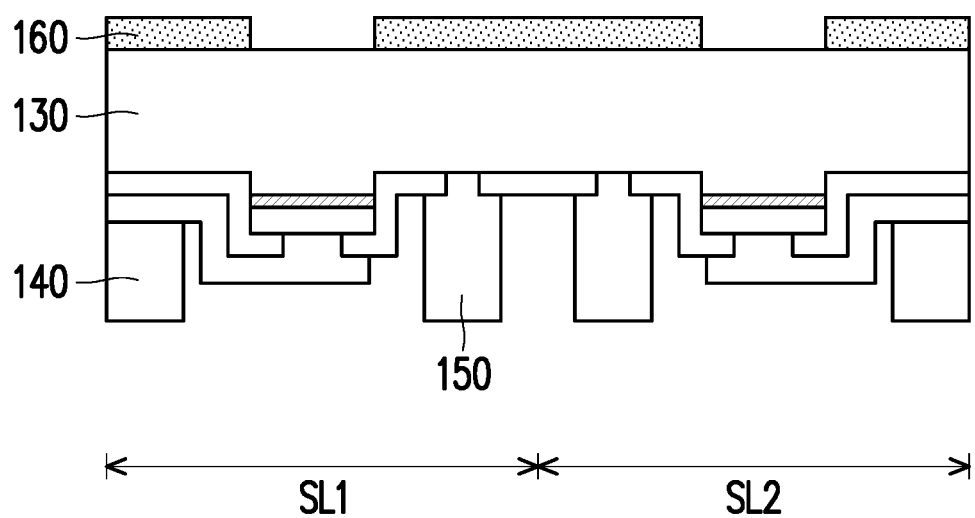
Figure 4A:
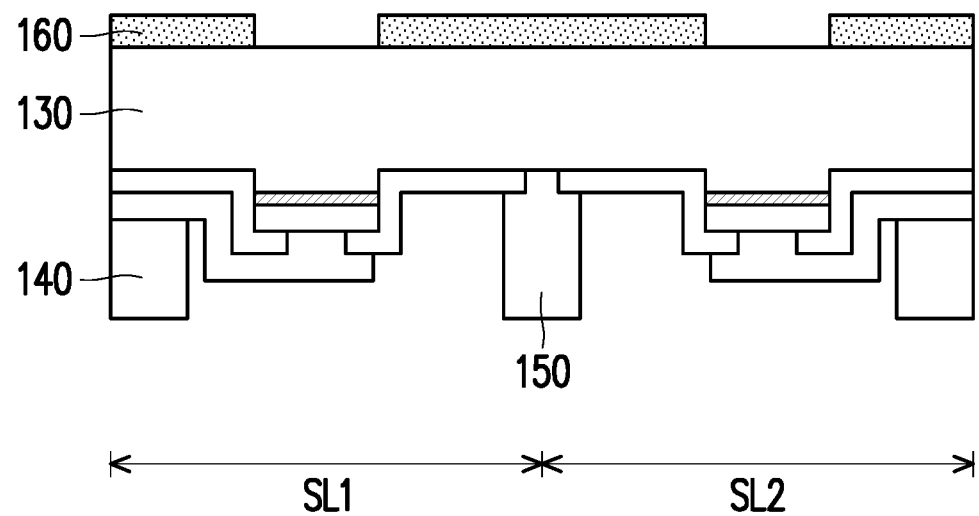
FIG. 4A to FIG. 4B are diagrams of an exemplary light emitting diode chip.
Figure 4B:
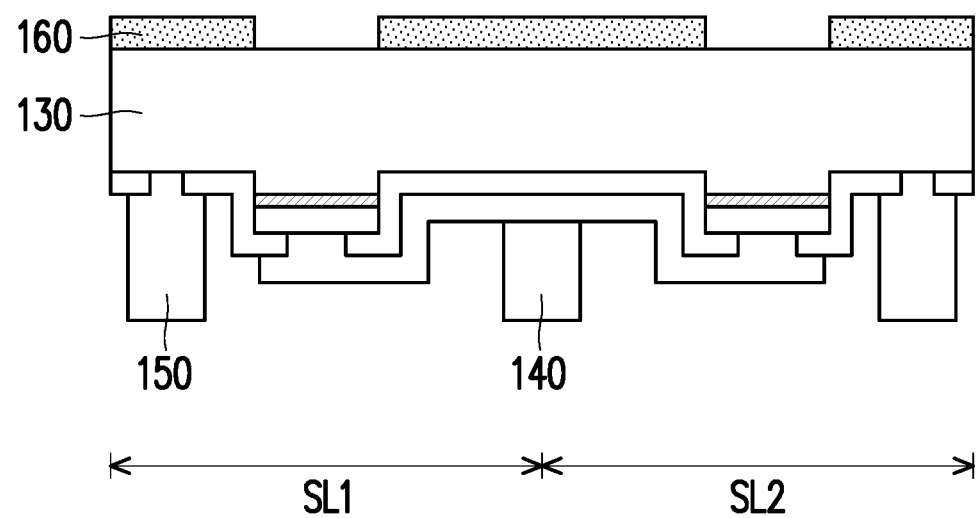

For example, FIG. 3A to FIG. 3B show an exemplary light emitting diode chip L03 of this type, wherein FIG. 3A is a top view, the light shielding layer 160 is omitted for clarity, and FIG. 3B is a cross sectional view along section line 3-3' in FIG. 3A. The light emitting diode chip L03 may be regarded as integrating two of the light emitting diode chip L01 shown in FIG. 2A into one light emitting diode chip, and similar details and features are not repeated herein. In some embodiments, sub chips SL1 and SL2 of the light emitting diode chip L03 respectively have a structure similar to that of the light emitting diode chip L01, and may be configured in a mirror-symmetrical manner. According to some embodiments, two adjacent sub chips in the plurality of sub chips of the light emitting diode chip may share the first electrode contact 140 or the second electrode contact 150. As shown in a light emitting diode chip L03A of FIG. 4A, the sub chips SL1 and SL2 of the light emitting diode chip L03A may share the second electrode contact 150. As shown in a light emitting diode chip L03B of FIG. 4B, the sub chips SL1 and SL2 of the light emitting diode chip L03B may share the first electrode contact 140.

Figure 5A:
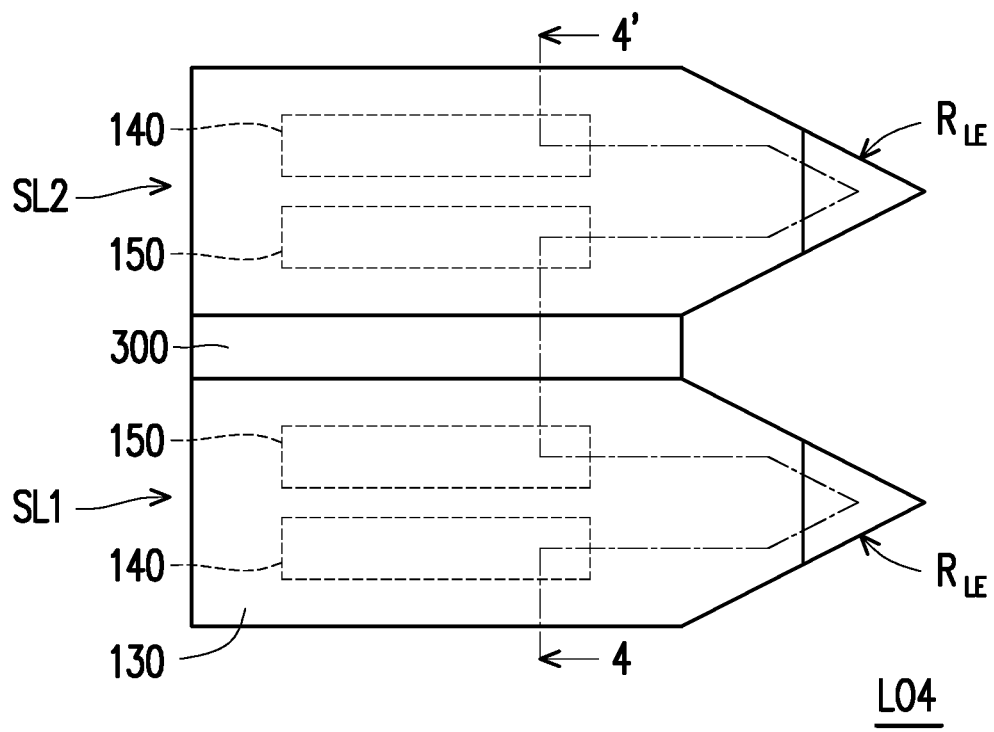
FIG. 5A to FIG. 5B are diagrams of an exemplary light emitting diode chip.
Figure 5B:
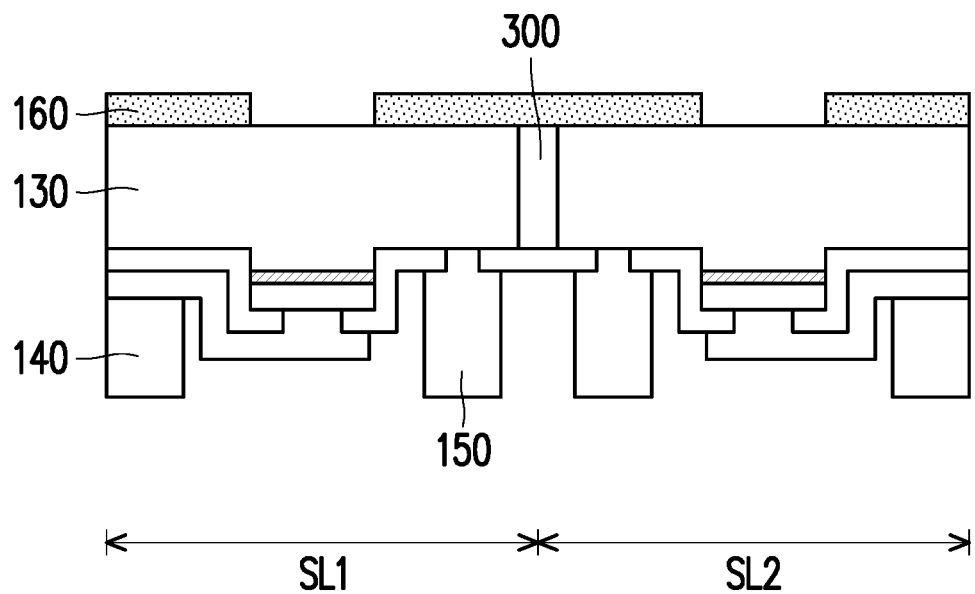

FIG. 5A to FIG. 5B show another exemplary light emitting diode chip L04, wherein FIG. 5A is a top view, the light shielding layer 160 is omitted for clarity, and FIG. 5B is a cross sectional view along section line 4-4' in FIG. 5A. The light emitting diode chip L04 is similar to the light emitting diode chip L03, and the difference is only in that the light emitting diode chip L04 further includes a dielectric insulating layer 300 disposed between the plurality of sub chips SL1 and SL2. The distribution range of the dielectric insulating layer 300 may be designed as necessary. Other details and features are not repeated herein. Although not shown in the attached drawings, two adjacent sub chips may share the first electrode contact 140 or the second electrode contact 150.

FIG. 6 to FIG. 10 show other exemplary pixel structures. The following only describes differences between the pixel structure in each figure and the pixel structure P1 shown in FIG. 1.

Figure 6:
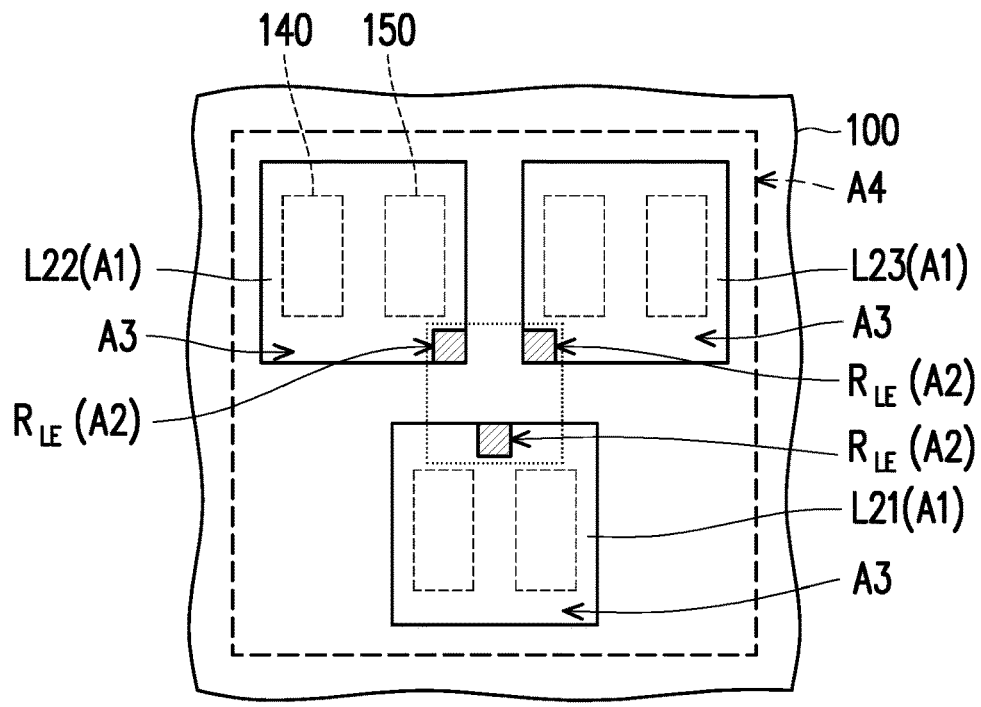
FIG. 6 is a diagram of an exemplary pixel structure.

In a pixel structure P2 of FIG. 6, the chip areas A1 of light emitting diode chips L21, L22, and L23 are square, and the light emitting areas A2 (the light emitting regions $R_{LE}$)

thereof are square. As indicated by the dotted lines, the light emitting regions $R_{LE}$ of the light emitting diode chips L21, L22, and L23 are close to the center of the pixel structure P2.

Figure 7:
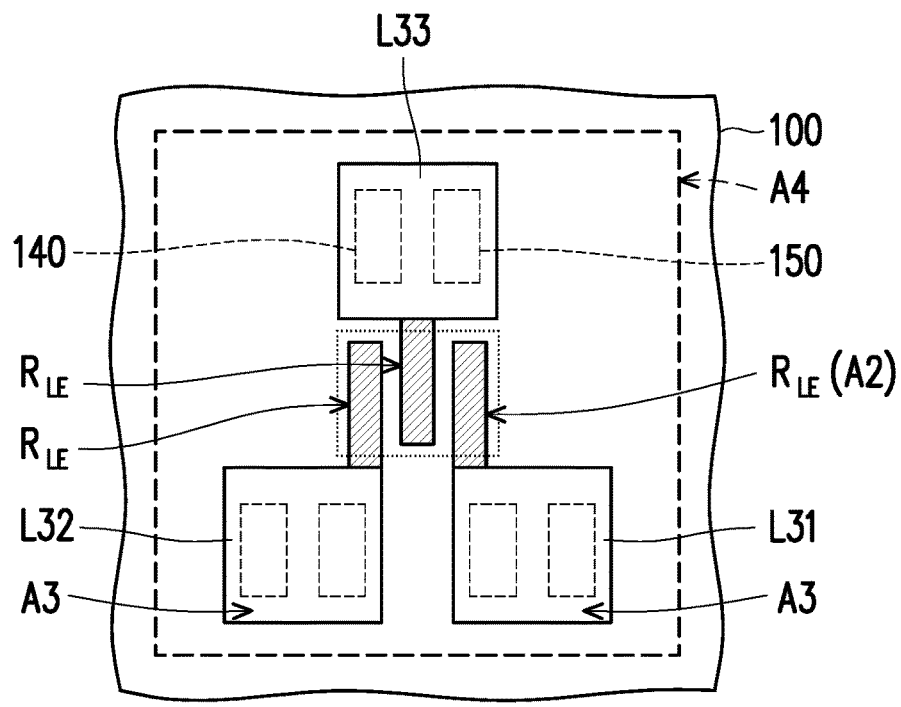
FIG. 7 is a diagram of an exemplary pixel structure.

In a pixel structure P3 of FIG. 7, the non-light emitting areas A3 of light emitting diode chips L31, L32, and L33 are square, and the light emitting areas A2 (the light emitting regions $R_{LE}$) thereof are rectangular. As indicated by the dotted lines, the light emitting regions $R_{LE}$ of the light emitting diode chips L31, L32, and L33 are close to the center of the pixel structure P3.

Figure 8:
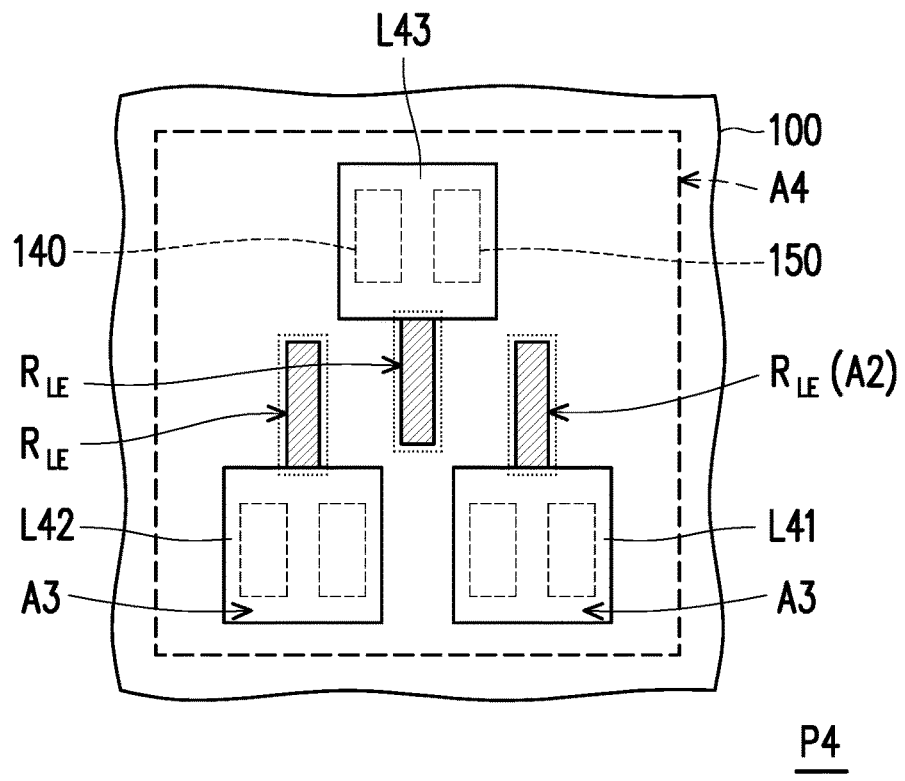
FIG. 8 is a diagram of an exemplary pixel structure.

In a pixel structure P4 of FIG. 8, the non-light emitting areas A3 of light emitting diode chips L41, L42, and L43 are square, and the light emitting areas A2 (the light emitting regions $R_{LE}$) thereof are rectangular. As indicated by the dotted lines, the light emitting regions $R_{LE}$ of the light emitting diode chips L41, L42, and L43 are arranged on a straight path, wherein the light emitting region $R_{LE}$ of the light emitting diode chip L43 is close to the center of the pixel structure P4, the light emitting region $R_{LE}$ of the light emitting diode chip L41 and the light emitting region $R_{LE}$ of the light emitting diode chip L42 are respectively located on opposite sides of the light emitting region $R_{LE}$ of the light emitting diode chip L43, and the light emitting region $R_{LE}$ of the light emitting diode chip L41 (or the light emitting region $R_{LE}$ of the light emitting diode chip L42) is located between the light emitting region $R_{LE}$ of the light emitting diode chip L43 and an edge of the pixel structure P4.

Figure 9:
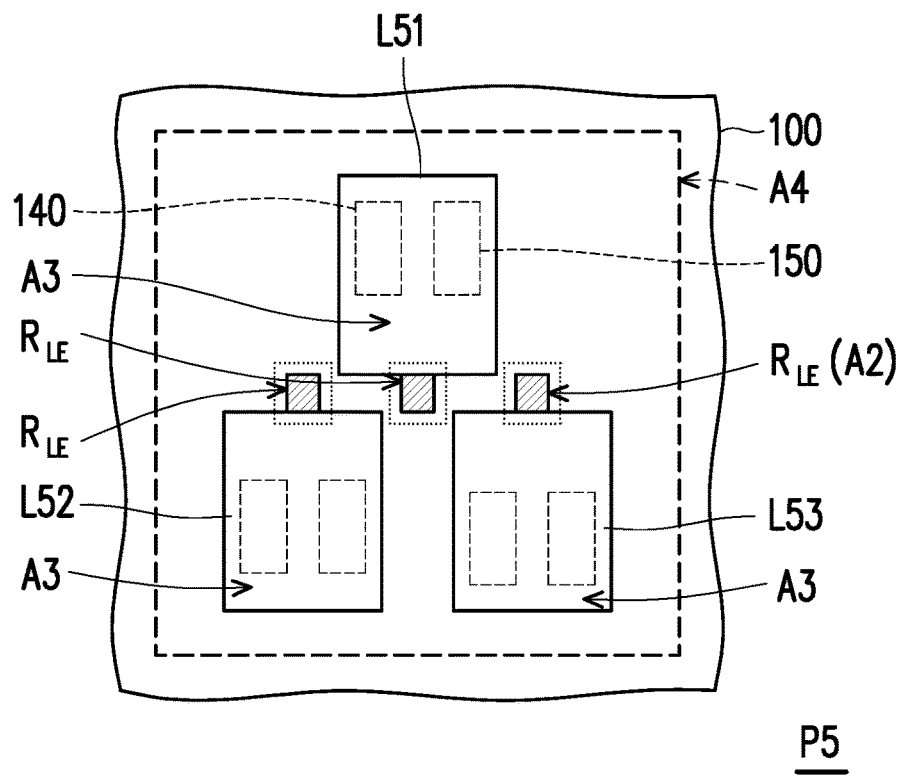
FIG. 9 is a diagram of an exemplary pixel structure.

In a pixel structure P5 of FIG. 9, the non-light emitting areas A3 of light emitting diode chips L51, L52, and L53 are rectangular, and the light emitting areas A2 thereof are rectangular. As indicated by the dotted lines, the light emitting regions $R_{LE}$ of the light emitting diode chips L51, L52, and L53 have a similar arrangement or distribution pattern with the light emitting regions $R_{LE}$ of the light emitting diode chips L41, L42, and L43 of FIG. 8 and are not repeated herein.

Figure 10:
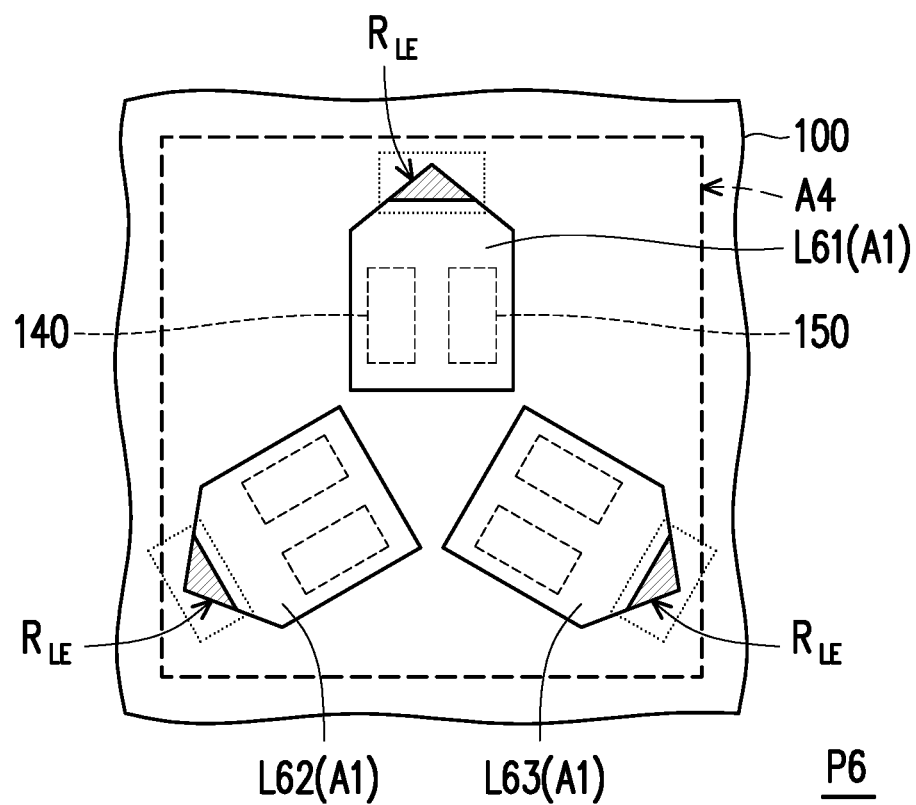
FIG. 10 is a diagram of an exemplary pixel structure.

In a pixel structure P6 of FIG. 10, the chip areas A1 of light emitting diode chips L61, L62, and L63 are pentagonal, and the light emitting areas A2 thereof are located at a corner of the pentagon. As indicated by the dotted lines, the light emitting regions $R_{LE}$ of the light emitting diode chips L61, L62, and L63 are close to an edge of the pixel structure P6.

The pixel structure according to an embodiment may be configured in an array and applied to a display. Since one light emitting diode chip may also be provided with a plurality of light emitting regions $R_{LE}$, the plurality of light emitting regions $R_{LE}$ may be shared to a plurality of adjacent pixel structures for use. Therefore, the number of mass transfers is reduced, and yield is improved. In the case where a plurality of light emitting regions $R_{LE}$ of one light emitting diode chip are shared to a plurality of adjacent pixel structures, the sub chips thereof located in each pixel structure may be regarded as the light emitting diode chips in one of the pixel structures above.

Figure 11:
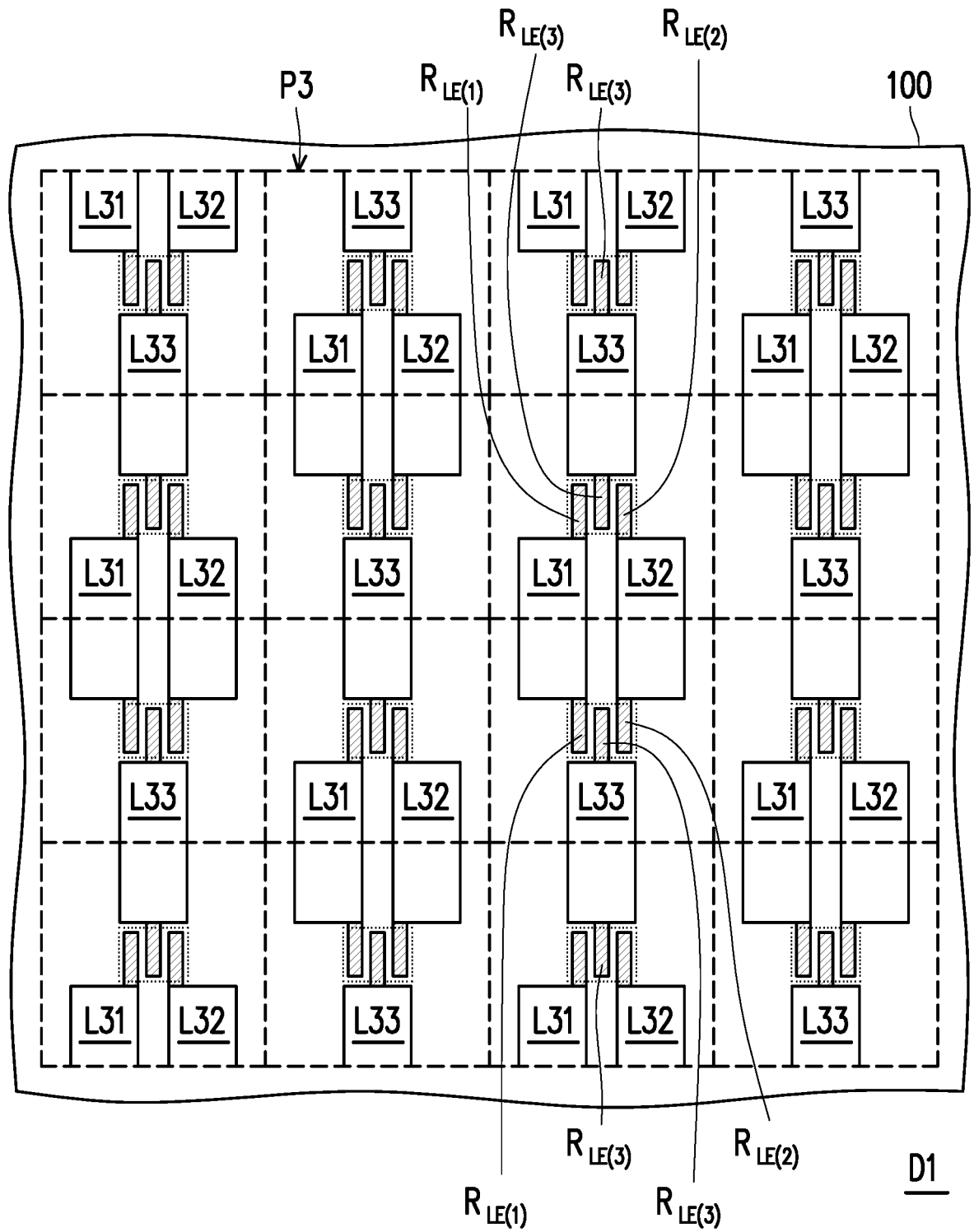
FIG. 11 is a diagram of an exemplary display.

For example, FIG. 11 shows an exemplary display D1 of this type. The display D1 has the pixel structure P3 shown in FIG. 7. The light emitting diode chip L31 has two light emitting regions $R_{LE(1)}$. The light emitting diode chip L32 has two light emitting regions $R_{LE(2)}$. The light emitting diode chip L33 has two light emitting regions $R_{LE(3)}$. Two adjacent pixel structures P3 (for example, two adjacent pixel structures P3 above and below) share one or two of the light emitting diode chips L31, L32, and L33, so that the number of light emitting diode chips used may be reduced.

Figure 12:
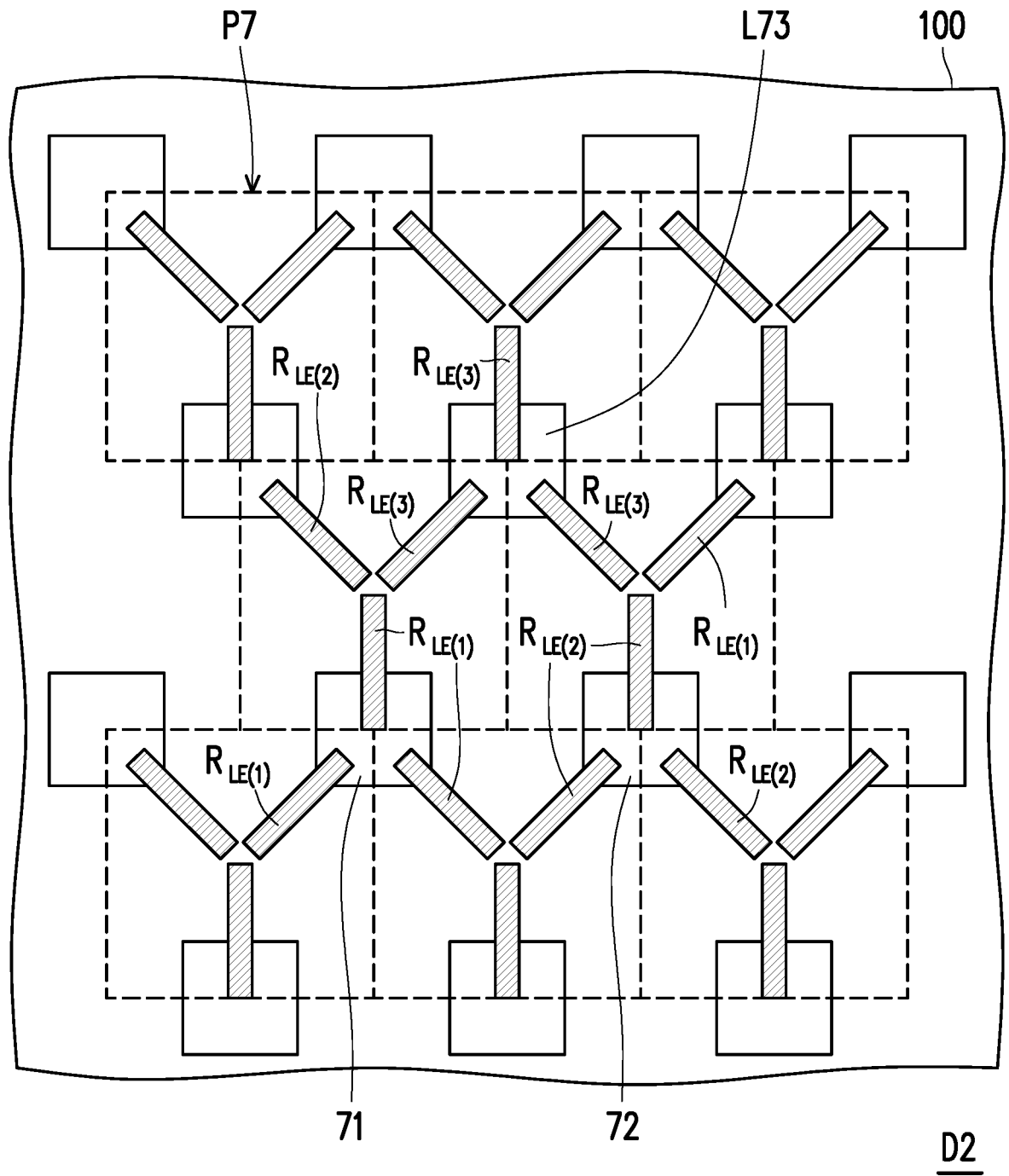
FIG. 12 is a diagram of an exemplary display.

FIG. 12 shows another exemplary display D2. The display D2 has a pixel structure P7. Light emitting diode chips L71, L72, and L73 applied to the pixel structure P7 also have a structure similar to the light emitting diode chips L01 to L05, but compared to the simple shape of the light emitting diode chips L11 to L63, the outer shape thereof is further adjusted. The light emitting diode chip L71 has three light emitting regions $R_{LE(1)}$. The light emitting diode chip L72 has three light emitting regions $R_{LE(2)}$. The light emitting diode chip L73 has three light emitting regions $R_{LE(3)}$. The three light emitting regions $R_{LE(1)}$, the three light emitting regions $R_{LE(2)}$, or the three light emitting regions $R_{LE(3)}$ are arranged radially. Adjacent pixel structures P7 share one of the light emitting diode chips L71, L72, and L73, so that the number of light emitting diode chips used may be reduced.

Based on the above, by using the light emitting diode chip according to an embodiment, the light emitting area may be readily adjusted by the design of the light emitting area. The light shielding layer may be used to further identify the light emitting area of the light emitting diode chip. Therefore, a small light emitting area may be provided at a predetermined position of the subpixel structures and the pixel structure, thus improving the contrast of the display and providing a good beam profile. In addition, a horizontal light emitting diode chip may be used in conjunction to facilitate the detection and repair of a dead pixel. A light emitting diode chip having a larger size may also be suitably selected to facilitate the process without adversely affecting the display effect. In addition, one light emitting diode chip may also be provided with a plurality of light emitting regions, and a plurality of light emitting regions may be shared to a plurality of adjacent pixel structures. Therefore, the number of mass transfers may be reduced, and therefore the yield is improved.

Although the disclosure is as disclosed above with preferred embodiments, the disclosure is not limited thereto. Those having ordinary knowledge in the art may make various changes and modifications without departing from the spirit and scope of the disclosure. The scope of the disclosure is defined by the claims.

What is claimed is:

1. A subpixel structure, comprising:
    a substrate; and
    a light emitting diode chip disposed on the substrate,
    wherein the light emitting diode chip has a chip area and a light emitting area, and the light emitting area is less than or equal to one tenth of the chip area,
    wherein the light emitting diode chip comprises:
        a first semiconductor layer having a first doping type;
        a light emitting layer disposed on the first semiconductor layer;
        a second semiconductor layer disposed on the light emitting layer and having a second doping type different from the first doping type;
        a first electrode contact electrically connected to the first semiconductor layer; and
        a second electrode contact electrically connected to the second semiconductor layer,
    wherein the first electrode contact and the second electrode contact are not overlapped with a light emitting region of the light emitting diode chip in a stacking direction of the first semiconductor layer, the light emitting layer, and the second semiconductor layer,
    wherein the light emitting region of the light emitting diode chip is defined by a light exit region of the light emitting diode chip that comprises a mesa portion comprising the first semiconductor layer, the light emitting layer, and the second semiconductor layer, and
    wherein a sectional line intersecting the first electrode contact and the second electrode contact along an arrangement direction of the first electrode contact and the second electrode contact does not intersect the light emitting region.

2. The subpixel structure of claim 1, wherein the light emitting diode chip comprises at least two of the light emitting region.

3. The subpixel structure of claim 2, wherein the at least two light emitting regions are separated by a dielectric insulating layer.

4. The subpixel structure of claim 1, wherein a total number of the first electrode contact and the second electrode contact comprised in the light emitting diode chip is greater than or equal to 3.

5. The subpixel structure of claim 1, wherein a total number of the first electrode contact and the second electrode contact comprised in the light emitting diode chip is an integer multiple of 2.

6. A pixel structure, comprising:
a substrate; and
a plurality of light emitting diode chips disposed on the substrate,
wherein at least one of the plurality of light emitting diode chips has a chip area and a light emitting area, and the light emitting area is less than or equal to one tenth of the chip area,
wherein the pixel structure has a pixel area, the plurality of light emitting diode chips have a total light emitting area, and the total light emitting area is less than or equal to one thirtieth of the pixel area,
wherein the at least one of the plurality of light emitting diode chips comprises:
a first semiconductor layer having a first doping type;
a light emitting layer disposed on the first semiconductor layer;
a second semiconductor layer disposed on the light emitting layer and having a second doping type different from the first doping type;
a first electrode contact electrically connected to the first semiconductor layer; and
a second electrode contact electrically connected to the second semiconductor layer,
wherein in at least one of the plurality of light emitting diode chips, the first electrode contact and the second electrode contact are not overlapped with a light emitting region of the light emitting diode chip in a stacking direction of the first semiconductor layer, the light emitting layer, and the second semiconductor layer,
wherein the light emitting region of the light emitting diode chip is defined by a light exit region of the light emitting diode chip that comprises a mesa portion comprising the first semiconductor layer, the light emitting layer, and the second semiconductor layer, and
wherein a sectional line intersecting the first electrode contact and the second electrode contact along an arrangement direction of the first electrode contact and the second electrode contact does not intersect the light emitting region.

7. The pixel structure of claim 6, wherein the plurality of light emitting diode chips comprise a first light emitting diode chip, a second light emitting diode chip, and a third light emitting diode chip, and an arrangement of the first light emitting diode chip, the second light emitting diode chip, and the third light emitting diode chip is triangular.

8. The pixel structure of claim 6, wherein the at least one of the plurality of light emitting diode chips comprises at least two of the light emitting region.

9. The pixel structure of claim 8, wherein the at least two light emitting regions are separated by a dielectric insulating layer.

10. The pixel structure of claim 6, wherein a total number of the first electrode contact and the second electrode contact comprised in the at least one of the plurality of light emitting diode chips is greater than or equal to 3.

11. The pixel structure of claim 6, wherein a total number of the first electrode contact and the second electrode contact comprised in the at least one of the plurality of light emitting diode chips is an integer multiple of 2.

12. A light emitting diode chip, comprising:
a first semiconductor layer having a first doping type;
a light emitting layer disposed on the first semiconductor layer;
a second semiconductor layer disposed on the light emitting layer and having a second doping type different from the first doping type;
a first electrode contact disposed under the first semiconductor layer and electrically connected to the first semiconductor layer;
a second electrode contact disposed under the second semiconductor layer and electrically connected to the second semiconductor layer; and
a light shielding layer disposed on the second semiconductor layer, wherein the first electrode contact and the second electrode contact are not overlapped with a light emitting region of the light emitting diode chip in a stacking direction of the first semiconductor layer, the light emitting layer, and the second semiconductor layer,
wherein the light emitting region of the light emitting diode chip is defined by a light exit region of the light emitting diode chip that comprises a mesa portion comprising the first semiconductor layer, the light emitting layer, and the second semiconductor layer, and
wherein a sectional line intersecting the first electrode contact and the second electrode contact along an arrangement direction of the first electrode contact and the second electrode contact does not intersect the light emitting region.

13. The light emitting diode chip of claim 12, wherein the light emitting diode chip comprises at least two of the light emitting region.

14. The light emitting diode chip of claim 13, wherein the at least two light emitting regions are separated by a dielectric insulating layer.

15. The light emitting diode chip of claim 12, wherein a total number of the first electrode contact and the second electrode contact comprised in the light emitting diode chip is greater than or equal to 3.

16. The light emitting diode chip of claim 12, wherein a total number of the first electrode contact and the second electrode contact comprised in the light emitting diode chip is an integer multiple of 2.

17. The light emitting diode chip of claim 12, further comprising:
an insulating layer disposed between the first semiconductor layer, the light emitting layer, and the second semiconductor layer, and the first electrode contact and the second electrode contact, wherein the insulating layer has a first opening and a second opening, the first electrode contact is in contact with the first semiconductor layer via the first opening, and the second electrode contact is in contact with the second semiconductor layer via the second opening.

18. The light emitting diode chip of claim 17, wherein the insulating layer is extended from a lower surface of the second semiconductor layer to at least a side surface of the first semiconductor layer via a side surface of the light emitting layer, and the light emitting diode chip further comprises:
- a connecting conductor disposed between the first electrode contact and the insulating layer, wherein an end of the connecting conductor is connected to the first electrode contact, and another end thereof is connected to the first semiconductor layer via the first opening.

19. The light emitting diode chip of claim 17, wherein the insulating layer is disposed on a lower surface of the first semiconductor layer and has a portion extended through the first semiconductor layer and the light emitting layer to the second semiconductor layer, and the light emitting diode chip further comprises:
- a first connecting conductor disposed between the first electrode contact and the insulating layer, wherein an end of the first connecting conductor is connected to the first electrode contact, and another end thereof is connected to the first semiconductor layer via the first opening; and
- a second connecting conductor extended through the first semiconductor layer and the light emitting layer to the second semiconductor layer, wherein an end of the second connecting conductor is connected to the second electrode contact, and another end thereof is connected to the second semiconductor layer.

* * * * *